US009947576B2

(12) United States Patent
Underwood et al.

(10) Patent No.: US 9,947,576 B2
(45) Date of Patent: Apr. 17, 2018

(54) UV-ASSISTED MATERIAL INJECTION INTO POROUS FILMS

(71) Applicant: Applied Materials, Inc., Santa Clara, CA (US)

(72) Inventors: Brian Saxton Underwood, Campbell, CA (US); Abhijit Basu Mallick, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/797,960

(22) Filed: Jul. 13, 2015

(65) Prior Publication Data

US 2017/0018455 A1      Jan. 19, 2017

(51) Int. Cl.
*H01L 21/76* (2006.01)
*H01L 21/768* (2006.01)
*H01L 21/02* (2006.01)

(52) U.S. Cl.
CPC .. *H01L 21/76825* (2013.01); *H01L 21/02126* (2013.01); *H01L 21/02203* (2013.01); *H01L 21/02271* (2013.01); *H01L 21/02274* (2013.01); *H01L 21/02337* (2013.01); *H01L 21/02348* (2013.01)

(58) Field of Classification Search
CPC ......... H01L 21/76825; H01L 21/02123; H01L 21/02203; H01L 21/02348; H01L 21/76822; H01L 21/76801; H01L 21/02107; H01L 21/02109; H01L 21/02112; H01L 21/02126; H01L 21/02167; H01L 21/02318; H01L 21/02321; H01L 21/02323; H01L 21/02329; H01L 21/02296; H01L 21/02205; H01L 21/02208; H01L 21/02211; H01L 21/02345; H01L 21/02104; H01L 21/02337
See application file for complete search history.

(56) References Cited

U.S. PATENT DOCUMENTS

| 6,238,751 | B1 | 5/2001 | Mountsier |
| 7,018,941 | B2 * | 3/2006 | Cui .................. H01L 21/02126 |
| | | | 257/E21.277 |
| 7,265,061 | B1 | 9/2007 | Cho et al. |

(Continued)

FOREIGN PATENT DOCUMENTS

JP           2013-521650           6/2013

*Primary Examiner* — Scott B Geyer
(74) *Attorney, Agent, or Firm* — Kilpatrick Townsend & Stockton LLP

(57) ABSTRACT

Methods are described for reducing shrinkage experienced by porous films on a patterned substrate. The film may be a silicon-and-hydrogen-containing layer which further contains one or two of carbon, oxygen and nitrogen. Shortly after deposition, the silicon-and-hydrogen-containing layer is treated by concurrent exposure to a relatively small molecule precursor (e.g. $NH_3$ or $C_2H_2$) and a source of UV light. The treatment may reduce subsequent shrinkage experienced by the porous film even at the bottom of the film due to the significant penetration prior to reaction. The treatment may reduce shrinkage at the bottom of a trench filled with the porous film.

7 Claims, 5 Drawing Sheets

(56) References Cited

U.S. PATENT DOCUMENTS

| | | |
|---|---|---|
| 9,023,737 B2 * | 5/2015 | Beynet .............. H01L 21/02318 |
| | | 438/787 |
| 9,406,547 B2 * | 8/2016 | Jhaveri ............. H01L 21/76224 |
| 2004/0058090 A1 | 3/2004 | Waldfried et al. |
| 2004/0175501 A1 | 9/2004 | Lukas et al. |
| 2004/0175957 A1 | 9/2004 | Lukas et al. |
| 2006/0105566 A1 * | 5/2006 | Waldfried ................ C23C 16/56 |
| | | 438/637 |
| 2007/0161230 A1 | 7/2007 | Chen et al. |
| 2008/0099918 A1 | 5/2008 | Streck et al. |
| 2009/0054674 A1 | 2/2009 | Lukas et al. |
| 2009/0061237 A1 * | 3/2009 | Gates ...................... C23C 16/30 |
| | | 428/446 |
| 2011/0159202 A1 | 6/2011 | Matsushita et al. |
| 2011/0198754 A1 | 8/2011 | Tagami et al. |
| 2012/0001304 A1 | 1/2012 | Asako |
| 2012/0070957 A1 | 3/2012 | Mallick et al. |
| 2013/0217241 A1 * | 8/2013 | Underwood ...... H01L 21/02126 |
| | | 438/778 |
| 2014/0045342 A1 | 2/2014 | Mallick et al. |
| 2015/0004797 A1 | 1/2015 | Nagarah et al. |
| 2015/0044882 A1 | 2/2015 | Draeger et al. |
| 2015/0056821 A1 * | 2/2015 | Ishikawa ........... H01L 21/02126 |
| | | 438/789 |
| 2015/0064932 A1 | 3/2015 | Matsushita et al. |
| 2015/0104943 A1 | 4/2015 | Goh et al. |

* cited by examiner

UV-ASSISTED MATERIAL INJECTION INTO POROUS FILMS

FIELD

Embodiments disclosed herein relate to processing porous films.

BACKGROUND

The miniaturization of semiconductor circuit elements has reached a point where feature sizes of about 14 nm are fabricated on a commercial scale. As the dimensions continue to get smaller, new challenges arise for process steps like filling a gap between circuit elements with a dielectric material that avoids electrical cross-talk. As the width between the elements continues to shrink, the gap between them often gets taller and narrower, making the gap difficult to fill without the dielectric material getting stuck to create voids or weak seams. Conventional chemical vapor deposition (CVD) techniques often experience an overgrowth of material at the top of the gap before it has been completely filled. This can create a void or seam in the gap where the depositing dielectric material has been prematurely cut off by the overgrowth; a problem sometimes referred to as breadloafing.

One solution to the breadloafing problem has been to use liquid precursors for the dielectric starting materials that more easily flow into the gaps. A technique currently in commercial use for doing this is called spin-on-glass (SOG). More recently, techniques have been developed that impart flowable characteristics to dielectric materials deposited by CVD. These techniques can deposit flowable precursors to fill a tall, narrow gap with porous material while reducing an incidence of creating voids or weak seams. While the new flowable CVD techniques represent a significant breakthrough in filling tall, narrow (i.e., high-aspect ratio) gaps with porous materials (such as low-k dielectric materials), there is still a need to reduce the shrinkage experienced by the porous material during subsequent processing.

SUMMARY

Methods are described for reducing shrinkage experienced by porous films on a patterned substrate. The film may be a silicon-and-hydrogen-containing layer which further contains at least one of carbon, oxygen and nitrogen. Shortly after deposition, the silicon-and-hydrogen-containing layer is treated by concurrent exposure to a relatively small molecule precursor (e.g. $NH_3$ or $C_2H_2$) and a source of UV light. The treatment may reduce subsequent shrinkage experienced by the porous film even at the bottom of the film due to the significant penetration prior to reaction. The treatment may reduce shrinkage at the bottom of a gap filled with the porous film which provides the benefit of maintaining a greater filling factor within the gap after processing is completed.

Embodiments described herein include methods of processing a gapfill dielectric on a patterned substrate. The methods include forming a silicon-and-hydrogen-containing film on the patterned substrate. The silicon-and-hydrogen-containing film fills a gap on the patterned substrate. The methods further include exposing the silicon-and-hydrogen-containing film to a hydrogen-containing precursor while exposing the silicon-and-hydrogen-containing film to UV-light. The hydrogen-containing precursor further includes at least one of nitrogen, silicon and carbon. The silicon-and-hydrogen-containing film may contain no elements other than silicon, carbon, nitrogen, hydrogen and oxygen following the operation of exposing the silicon-and-hydrogen-containing film.

Embodiments described herein include methods of filling a gap in a patterned substrate. The methods include flowing low-k dielectric material into the gap on the patterned substrate. The methods further include exposing the low-k dielectric material to a hydrogen-containing precursor. The methods further include exposing the patterned substrate to UV-light. The operation of exposing the patterned substrate to UV-light and exposing the low-k dielectric material to a hydrogen-containing precursor occur concurrently.

Embodiments described herein include methods of strengthening gapfill material. The methods include transferring a patterned substrate having a gap into a substrate processing region of a substrate processing chamber. The gap is filled with a porous dielectric. The methods further include flowing a hydrogen-containing precursor into the substrate processing region while concurrently shining UV light on the gap. The methods further include heating the patterned substrate, wherein heating the patterned substrate shrinks the porous dielectric near the bottom of the gap less than 35%. Heating the patterned substrate may increase the temperature of the substrate above 150° C., above 200° C., above 250° C. or above 300° C. according to embodiments.

Additional embodiments and features are set forth in part in the description that follows, and in part will become apparent to those skilled in the art upon examination of the specification or may be learned by the practice of the embodiments. The features and advantages of the embodiments may be realized and attained by means of the instrumentalities, combinations, and methods described in the specification.

DESCRIPTION OF THE DRAWINGS

A further understanding of the nature and advantages of the embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Methods are described for reducing shrinkage experienced by porous films on a patterned substrate. The film may be a silicon-and-hydrogen-containing layer which further contains one or two of carbon, oxygen and nitrogen. Shortly after deposition, the silicon-and-hydrogen-containing layer is treated by concurrent exposure to a relatively small molecule precursor (e.g. $NH_3$ or $C_2H_2$) and a source of UV light. The treatment may reduce subsequent shrinkage experienced by the porous film even at the bottom of the film due to the significant penetration prior to reaction. The treatment may reduce shrinkage at the bottom of a gap filled with the porous film which provides the benefit of maintaining a greater filling factor within the gap after processing is completed.

Porous materials may be used, for example, to produce low-k dielectric films but may be useful in other circumstances. Porous films may be formed by a variety of methods including non-flowable or flowable deposition methods. Flowable deposition methods may be helpful by enabling the porous films to penetrate into gaps in a patterned substrate. Porous films can be prone to shrinking especially when the temperature of the patterned substrate is raised during post-deposition processing. A UV light treatment with concurrent exposure as described herein has been found to benefit the structure of the porous films. Hydrogen may be being replaced by nitrogen, silicon, and/or carbon from the hydrogen-containing precursor in a UV-assisted chemical reaction. UV light is needed to promote the reaction but maintains a low reaction probability needed to penetrate deeply into the porous film first. Porous films produced using the techniques presented herein may exhibit much less shrinkage during post-deposition processing and during the lifespan of the semiconductor devices produced. Reduced shrinkage may benefit the operation of the semiconductor device by (1) reducing cross-talk between conducting elements and (2) providing greater physical stability which increases production yield. Material from the concurrently exposed precursors is transferred into the porous films much more deeply than previously achieved, which beneficially reduces shrinkage even at the bottom of tight spaces. While some porous gapfill films have displayed shrinkage of 50%, the methods described herein may shrink less than 35%, less than 30% or less than 25% after deposition according to embodiments.

Figure 1:
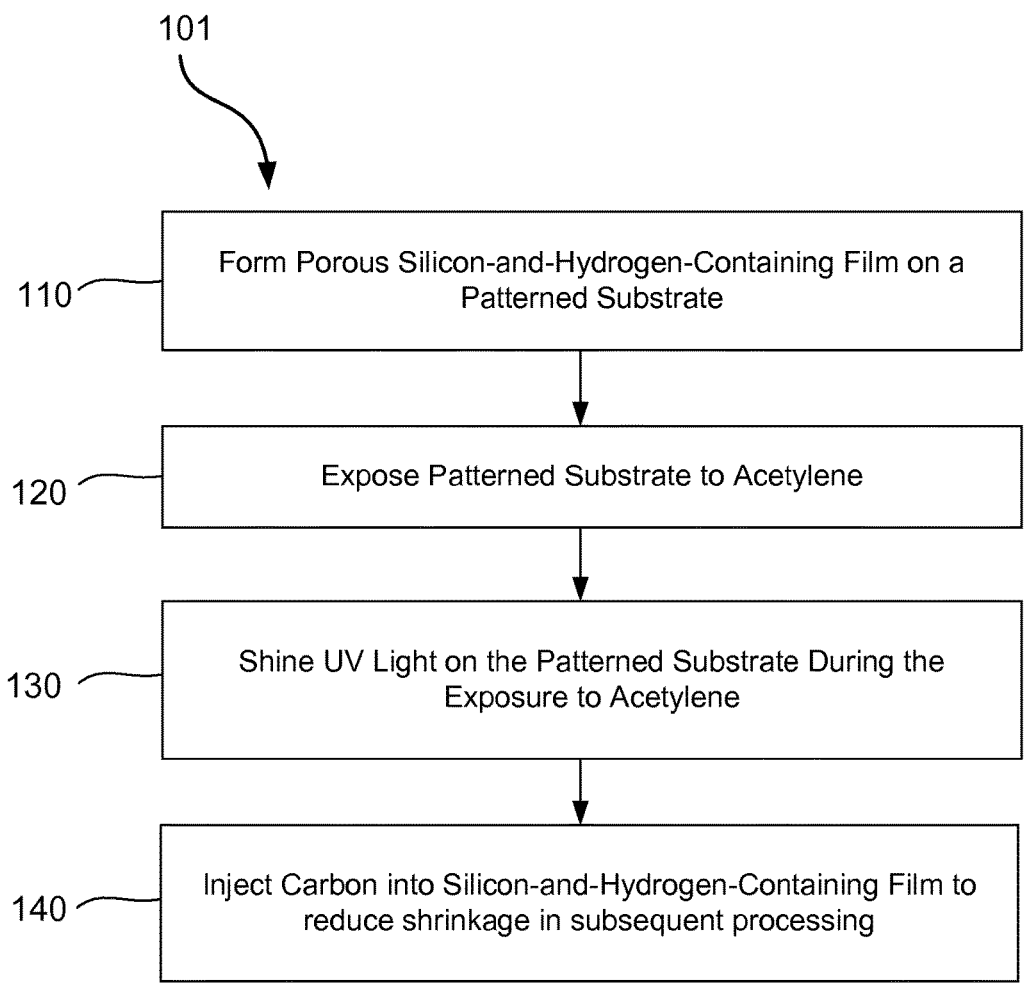
FIG. 1 is a flowchart illustrating selected steps in a method of forming a porous film on a patterned substrate according to embodiments.

To better understand and appreciate the embodiments, reference is now made to FIG. 1 which is a flowchart illustrating selected steps in a method 101 of forming a porous film on a substrate according to embodiments. A porous silicon-and-hydrogen-containing film is initially formed on a patterned substrate in operation 110. The patterned substrate may then be placed in a substrate processing region. In operation 120, $C_2H_2$ is flowed into the substrate processing region. The patterned substrate is illuminated with ultraviolet (UV) light at the same time as the patterned substrate is exposed to the $C_2H_2$. In embodiments, the $C_2H_2$ is flowed into the substrate processing region prior to the beginning of the UV light exposure to get $C_2H_2$ deep into the film before illumination. Aside from the effects of the UV light, the substrate processing region may be plasma-free during operations 120 and 130. Carbon from the $C_2H_2$ enters the porous silicon-and-hydrogen-containing film and processes the film all the way to the bottom according to embodiments (operation 140).

Generally speaking, a hydrogen-containing precursor further comprising at least one of nitrogen, silicon, and carbon may be flowed into the substrate processing region. The hydrogen-containing precursor may comprise or consist of hydrogen and carbon in embodiments. The hydrogen-containing precursor may have two, three, or four carbon atoms and may contain at least one multiple bond (a double bond or a triple bond) according to embodiments. For example, the hydrogen-containing precursor may be one of $C_2H_2$, $C_2H_4$, $C_3H_6$ and $C_4H_8$. The hydrogen-containing precursor may comprise or consist of hydrogen and nitrogen according to embodiments. The hydrogen-containing precursor may have one or two nitrogen atoms and may contain a dangling bond in embodiments. For example, the hydrogen-containing precursor may be one of $NH_3$, $N_2H_2$ and $N_2H_4$. The hydrogen-containing precursor may comprise or consist of hydrogen and silicon in embodiments. The hydrogen-containing precursor may have two, three, (and sometimes more) silicon atoms and may comprise or consist of single bonds according to embodiments. For example, the hydrogen-containing precursor may be one of $SiH_4$, $Si_2H_6$, $Si_3H_8$, $Si_4H_{10}$, $Si_5H_{10}$, $Si_5H_{12}$, $Si_6H_{12}$, and $Si_6H_{14}$. The hydrogen-containing precursor comprise hydrogen, silicon and carbon and may comprise a C=O ligand in embodiments. The hydrogen-containing precursor may be accompanied by one or more additional gases such a hydrogen ($H_2$), nitrogen ($N_2$), helium, neon, argon according to embodiments. The substrate processing region may be devoid of moisture and may be devoid of oxygen during the ultraviolet treatments of all embodiments disclosed herein according to embodiments. The environment surrounding the porous dielectric film may be chemically inert other than the hydrogen-containing precursor in embodiments.

The precursors described herein have been selected based on small size and, in some cases, reduced direct absorption of UV light. Both these properties help the precursors to penetrate more deeply into the materials described shortly before reacting to densify and strengthen the porous films. Premature absorption of the UV light by the precursors would increase the chemical reactivity too early which would deplete the precursors near the top of the porous film. In embodiments, the reaction mechanism involves absorption of the UV light by the porous substrate which is then reactive to the hydrogen-containing precursor. A small size of the precursor also promotes rapid diffusion deep within an open-cell porous substrate. Essentially no deposition occurs on top of the porous film during operations 120/130.

In operation 110, the porous film may be deposited by a variety of methods such as spin-on glass (SOG), spin-on dielectric (SOD) or by chemical vapor deposition (CVD). The porous film may flow after initial deposition which may help fill narrow gaps on a patterned substrate. The porous film may be referred to as a flowable porous film and may have a low dielectric constant (low-k) as measured after solidification. A low-k dielectric film may have a dielectric constant of between 2.2 and 3.0 in the trench of a completed device according to embodiments. The porous film comprises silicon and hydrogen and may be a S—C—H film, a Si—N—H film, a Si—O—H film, a Si—C—N—H film, a Si—O—C—H film or a Si—O—N—H film in embodiments. The porous film may comprise or consist of silicon, carbon and hydrogen according to embodiments. The porous film may comprise or consist of silicon, nitrogen and hydrogen according to embodiments. The porous film may comprise or consist of silicon, oxygen and hydrogen according to embodiments. The porous film may comprise or consist of silicon, carbon, nitrogen and hydrogen according to embodiments. The porous film may comprise or consist of silicon, carbon, oxygen and hydrogen according to embodiments. The porous film may comprise or consist of silicon, oxygen, nitrogen and hydrogen according to embodiments.

The patterned substrate is treated by flowing the hydrogen-containing precursor into the substrate processing region while irradiating the patterned substrate with UV light to cause a chemical reaction with the porous film in operations 120/130. The substrate processing region may be devoid of plasma (may be plasma-free) during operation 140 in embodiments to avoid making the hydrogen-containing precursor too reactive in which case the depth of the treatment effectiveness would be reduced. The hydrogen-containing precursor may not be passed through any plasma en route to the substrate processing region according to embodiments. The treated film has been found to shrink less and retain more physical strength than an untreated otherwise-similar film. Nitrogen, silicon or carbon is injected into the porous film and may be forming bridge-bonded sites which cause the increase in strength of the porous film even in portions deep within narrow gaps. Short silicon chains are suspected of undergoing volatilization when the methods herein are not undertaken, which may lead to the greater shrinkage. The methods described herein may also be reducing voids within gaps, further benefitting the performance and reliability of completed devices. The strength and coincident reduction in shrinkage may be substantially uniform at all depths within the porous film according to embodiments (outside or inside a gap).

The gaps (e.g. vias and trenches) filled using the techniques described herein may have a height and width that define an aspect ratio (AR) of the height to the width (i.e., H/W) that is significantly greater than 1:1 (e.g., greater than 5:1, greater than 6:1, greater than 8:1, greater than 10:1 or greater than 12:1). In many instances the high AR is due to small gap widths below 32 nm, below 28 nm, below 22 nm or below 16 nm according to embodiments. The height may be greater than 100 nm, greater than 150 nm, greater than 250 nm or greater than 0.5 μm in embodiments. "Top" and "Up" will be used herein to describe portions/directions perpendicularly distal from the substrate plane and further away from the center of mass of the substrate in the perpendicular direction. "Vertical" will be used to describe items aligned in the "Up" direction towards the "Top". Other similar terms (such as "height" and "width") may be used whose meanings will now be clear.

The temperature of the substrate during operations 120/130 may be less than 150° C., less than 120° C., less than 100° C. or less than 80° C. in embodiments since the chemical reaction with the hydrogen-containing precursor (e.g. $C_2H_2$) does not rely on temperature to proceed. Higher temperatures may be used since the desired chemical reaction will still occur up to the point where thermally-activated deposition occurs (~400° C. for $C_2H_2$). The temperature of the patterned substrate may be maintained below each of these temperatures between operation 110 and the start of operations 120/130 to avoid damaging the film before it can be strengthened according to embodiments. Higher temperatures may be used since the desired chemical reaction will still occur up to the point where thermally-activated deposition occurs (~400° C. for $C_2H_2$). The temperature of the patterned substrate may be less than 500° C., less than 400° C. or less than 300° C. during operations 120/130 and between operation 110 and 120/130 in embodiments.

The pressure in the substrate processing region may be between 1 Torr and 1000 Torr, or between 3 Torr and 200 Torr or between 6 Torr and 50 Torr during the UV treatment of the porous film in operations 120/130. Higher pressures may help to more uniformly treat less porous films. All film properties and process parameters given for all examples herein apply to all other examples as well. The hydrogen-containing precursor may be flowed into the substrate processing region at a flow rate between 10 sccm and 4000 sccm, between 200 sccm and 3000 sccm, or between 500 sccm and 2000 sccm in embodiments. The hydrogen-containing precursor may be supplied in the form of a gas or a liquid. The wavelengths of suitable UV light for all methods described herein may be between 100 nm and 450 nm, or may be between 100 nm and 400 nm in disclosed embodiments. The UV light may be generated within or outside the substrate processing region and passed through into the substrate processing region by way of a suitably transmissive vacuum viewport. The UV light may be generated by an excimer laser.

Figure 2:
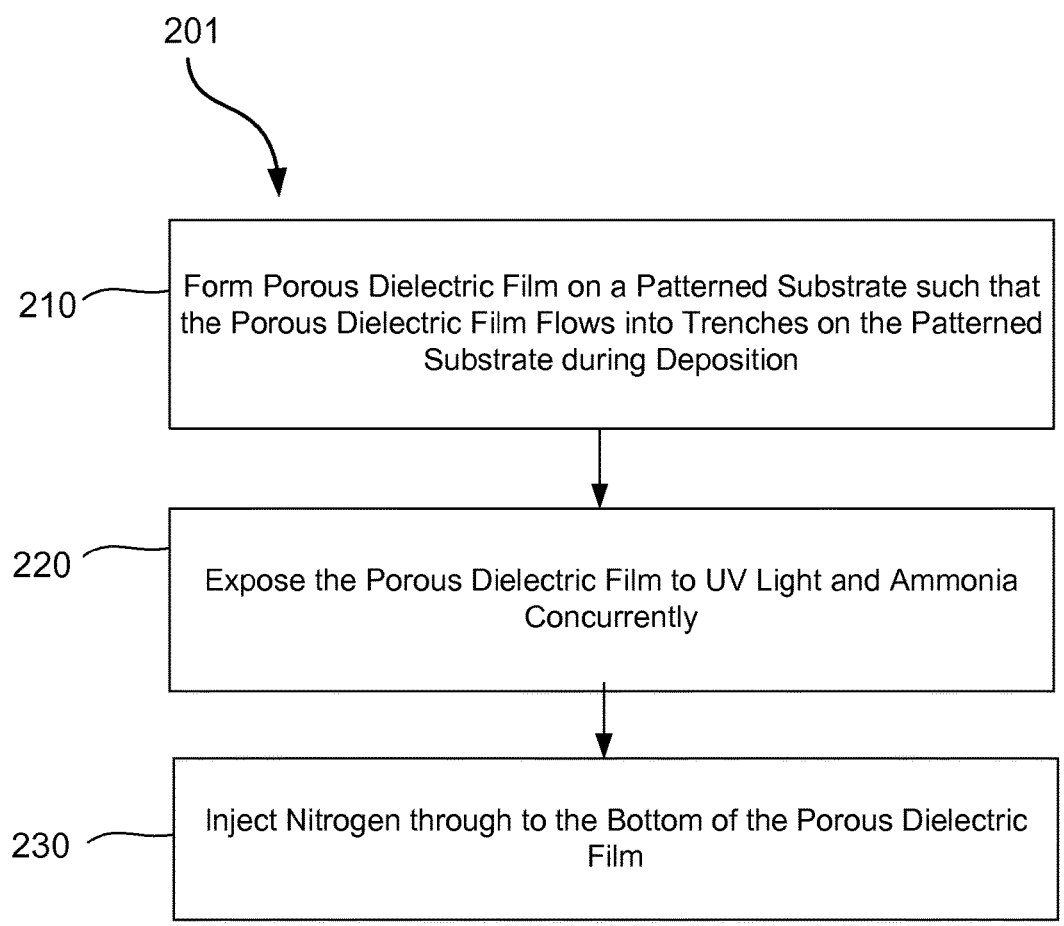
FIG. 2 is a flowchart illustrating selected steps in a method of forming a porous film on a patterned substrate according to embodiments.

Reference will now be made to FIG. 2 which is a flowchart illustrating selected steps in a method 201 of forming a porous dielectric film on a substrate according to embodiments. A porous film is initially formed on a patterned substrate in operation 210. The patterned substrate may then be placed in a substrate processing region. In operation 220, the patterned substrate is exposed to $NH_3$ inside the substrate processing region while also illuminating the patterned substrate with ultraviolet (UV) light. Exposure to the $NH_3$ may be initiated before the exposure to UV light to ensure deeper penetration into the porous dielectric film according to embodiments. As before, the substrate processing region may be plasma-free during operation 220. Nitrogen from the $NH_3$ enters the porous film and processes the film substantially uniformly from top to bottom according to embodiments (operation 230). As with the other examples presented herein, the contemporaneous presence of both UV light and the hydrogen-containing precursor (e.g. $NH_3$) has been found to result in a porous dielectric layer which exhibits substantially less shrinkage in subsequent processing.

For all examples described herein, the patterned substrate may not be exposed to external atmosphere (atmosphere from the cleanroom outside a semiconductor processing mainframe or chamber) from the operation of forming the porous film on the patterned substrate to the operations of exposing the patterned substrate to the hydrogen-containing precursor and illuminating the patterned substrate with UV light to strengthen the porous film according to embodiments.

Any or all of the deposition methods described herein may have a low electron temperature in the substrate processing region during the deposition to ensure the beneficial chemical reactions deep within the porous film according to embodiments. The electron temperature may be measured using a Langmuir probe in the substrate processing region. In embodiments, the electron temperature may be less than 0.5 eV, less than 0.45 eV, less than 0.4 eV, or less than 0.35 eV. Introducing alternative nomenclature, the substrate processing region may be described herein as "plasma-free" during the deposition processes described herein. "Plasma-free" does not necessarily mean the region is devoid of plasma. Ionized species and free electrons created within the plasma region may travel through pores (apertures) in the partition (showerhead) at exceedingly small concentrations. The borders of the plasma in the chamber plasma region are hard to define and may encroach upon the substrate processing region through the apertures in the showerhead. Furthermore, a low intensity plasma may be created in the substrate processing region without eliminating desirable features of the deposition processes described herein. All causes for a plasma having much lower intensity ion density than the chamber plasma region during the creation of the excited plasma effluents do not deviate from the scope of "plasma-free" as used herein.

Figure 3:
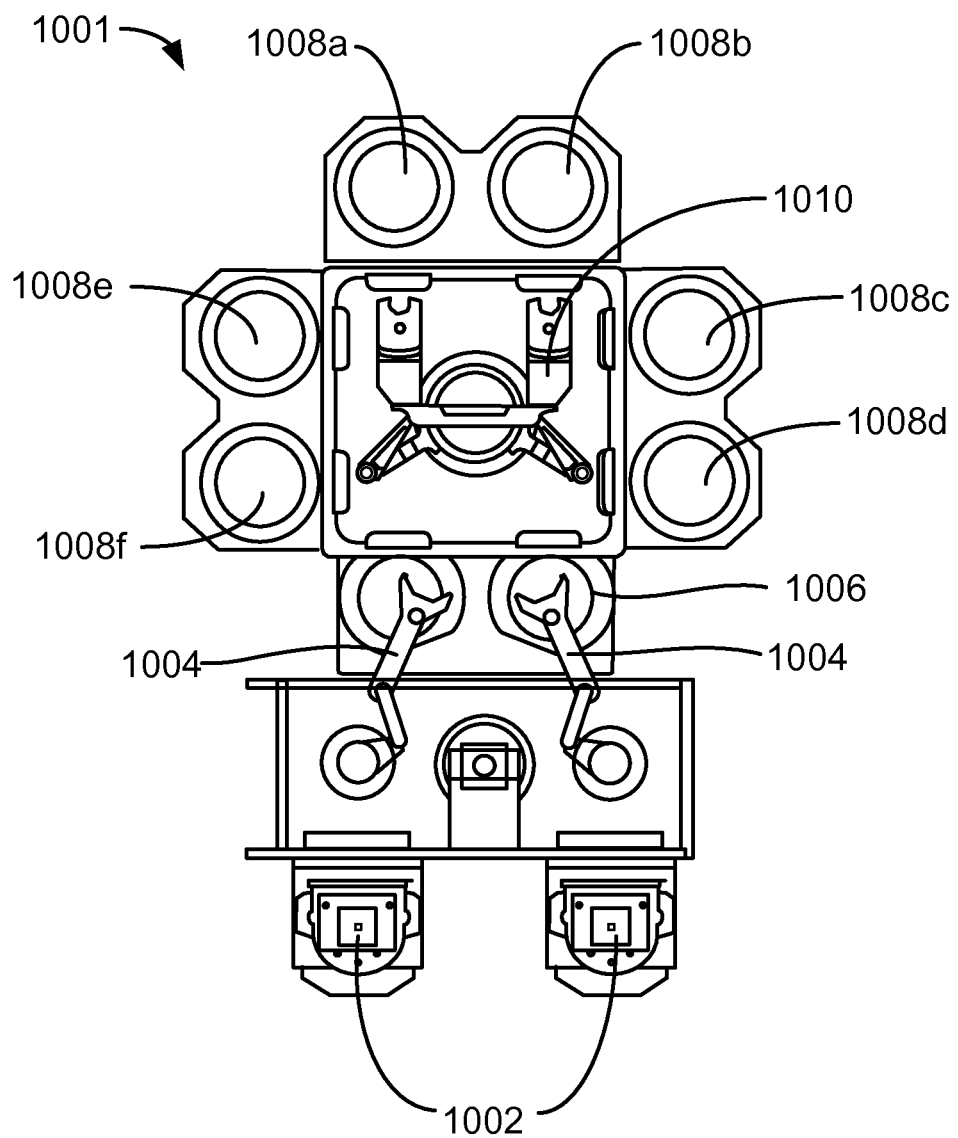
FIG. 3 shows a substrate processing system according to embodiments.

Several embodiments of substrate processing chambers which can form the porous films will now be described and may also be used to chemically treat the patterned substrate in some select configurations. FIG. 3 shows an exemplary processing system 1001 for deposition and curing chambers according to embodiments. FOUPs (front opening unified pods) 1002 supply substrates by way of robotic arms 1004 into low pressure holding areas 1006. A second robotic arm 1010 may be used to transport the substrate wafers from holding areas 1006 to substrate processing chambers 1008a-f and back.

Substrate processing chambers 1008a-f may be configured to deposit or perform a variety of treatments on the deposited layer(s). In one configuration, two pairs of the processing chamber (e.g., 1008c-d and 1008e-f) may be used to deposit the flowable dielectric material on the substrate, and the third pair of processing chambers (e.g., 1008a-b) may be used to cure the dielectric material using ultraviolet or e-beam illumination.

Figure 4A:
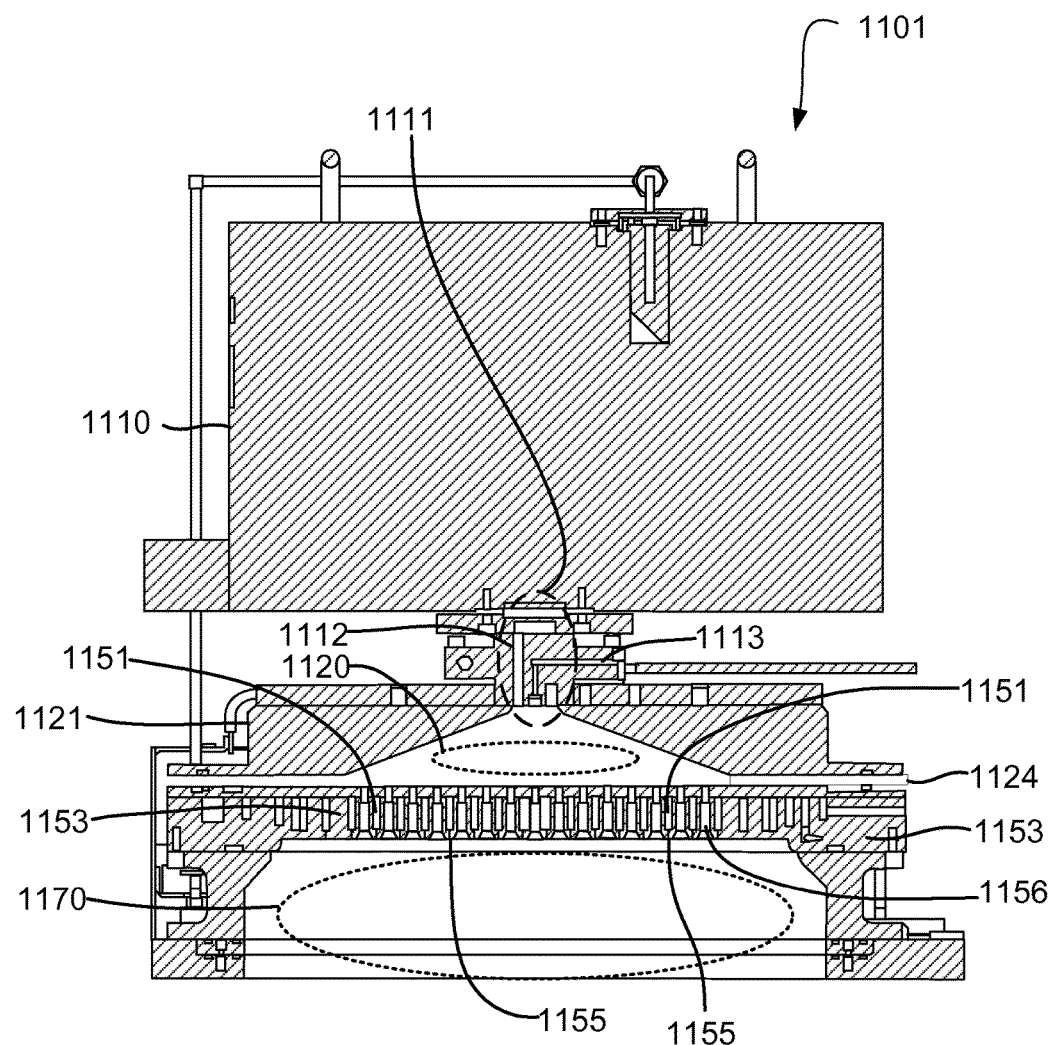
FIG. 4A shows a substrate processing chamber according to embodiments.

FIG. 4A is a substrate processing chamber 1101 according to embodiments. A remote plasma system (RPS) 1110 may process a gas which then travels through a gas inlet assembly 1111. Two distinct gas supply channels are visible within the gas inlet assembly 1111. A first channel 1112 carries a gas that passes through the remote plasma system (RPS) 1110, while a second channel 1113 bypasses the RPS 1110. The first channel 1112 may be used for the process gas and the second channel 1113 may be used for a treatment gas in embodiments. The lid (or conductive top portion) 1121 and a perforated partition 1153 are shown with an insulating ring 1124 in between, which allows an AC potential to be applied to the lid 1121 relative to perforated partition 1153. The process gas travels through first channel 1112 into chamber plasma region 1120 and may be excited by a plasma in chamber plasma region 1120 alone or in combination with RPS 1110. The combination of chamber plasma region 1120 and/or RPS 1110 may be referred to as a remote plasma system herein. The perforated partition (also referred to as a showerhead) 1153 separates chamber plasma region 1120 from a substrate processing region 1170 beneath showerhead 1153. Showerhead 1153 allows a plasma present in chamber plasma region 1120 to avoid directly exciting gases in substrate processing region 1170, while still allowing excited species (plasma effluents) to travel from chamber plasma region 1120 into substrate processing region 1170.

Showerhead 1153 is positioned between chamber plasma region 1120 and substrate processing region 1170 and allows plasma effluents (excited derivatives of precursors or other gases) created within chamber plasma region 1120 to pass through a plurality of through holes 1156 that traverse the thickness of the plate. The showerhead 1153 also has one or more hollow volumes 1151 which can be filled with a precursor (e.g. TSA) in the form of a vapor or gas (such as a silicon-and-carbon-containing precursor) and pass through small holes 1155 into substrate processing region 1170 but not directly into chamber plasma region 1120.

In the embodiment shown, showerhead 1153 may distribute (via through holes 1156) process gases which contain plasma effluents of process gases upon excitation by a plasma in chamber plasma region 1120. A nitrogen-containing precursor (e.g. $NH_3$) may be flowed through RPS 1110 to form a Si—N—H film when the plasma effluents created encounter TSA. The precursors may be selected to form the various films treated herein by chemical vapor deposition. Other techniques may be used to form porous films without using chemical vapor deposition (e.g. SOD or SOG). The process gas may also include a carrier gas such as helium, argon, nitrogen ($N_2$), etc. The second channel 1113 may also deliver a process gas and/or a carrier gas, and/or a film-treatment or curing gas used to remove an unwanted component from the growing or as-deposited film. Plasma effluents may include ionized or neutral derivatives of the process gas and may also be referred to herein as a radical-oxygen precursor referring to the atomic constituent of the process gas introduced.

Figure 4B:
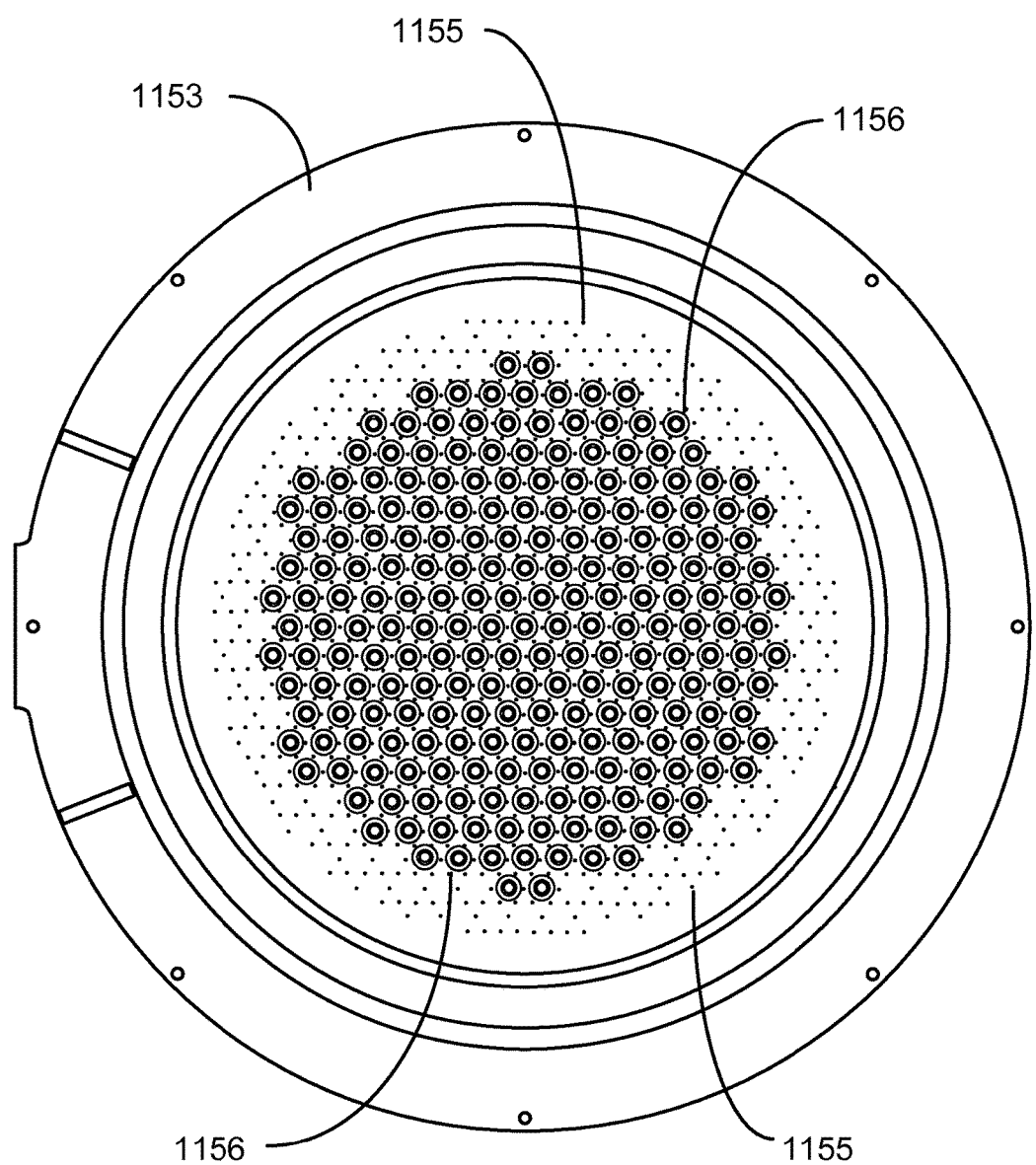
FIG. 4B shows a gas distribution showerhead according to embodiments.

FIG. 4B is a bottom view of a showerhead 1153 for use with a processing chamber according to embodiments. Showerhead 1153 corresponds with the showerhead shown in FIG. 4A. Through-holes 1156 are depicted with a larger inner-diameter (ID) on the bottom of showerhead 1153 and a smaller ID at the top. Small holes 1155 are distributed substantially evenly over the surface of the showerhead, even amongst the through-holes 1156 which helps to provide more even mixing.

An exemplary film is created on a substrate supported by a pedestal (not shown) within substrate processing region 1170 when plasma effluents arriving through through-holes 1156 in showerhead 1153 combine with a silicon-and-carbon-containing precursor arriving through the small holes 1155 originating from hollow volumes 1151. Though substrate processing region 1170 may be equipped to support a plasma for other processes such as curing, no plasma is present during the growth of the exemplary film. The pedestal may be configured to cool or heat a supported substrate to maintain relatively low temperatures (from room temperature through about 120° C.).

A plasma may be ignited either in chamber plasma region 1120 above showerhead 1153 or substrate processing region 1170 below showerhead 1153. A plasma is present in chamber plasma region 1120 to produce the radical-oxygen precursor from an inflow of an oxygen-containing gas. An AC voltage typically in the radio frequency (RF) range is applied between the conductive top portion 1121 of the processing chamber and showerhead 1153 to ignite a plasma in chamber plasma region 1120 during deposition. An RF power supply generates a high RF frequency of 13.56 MHz but may also generate other frequencies alone or in combination with the 13.56 MHz frequency. Exemplary RF frequencies include microwave frequencies such as 2.4 GHz. The remote plasma power may be greater than or about 1000 watts, greater than or about 2000 watts, greater than or about 3000 watts or greater than or about 4000 watts in embodiments, during deposition of the flowable film. The substrate processing system is controlled by a system controller. A process for depositing a film stack on a substrate can be implemented using a computer program product that is executed by the system controller.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. The term "precursor" is used to refer to any process gas which takes part in a reaction to either remove material from or deposit material onto a surface. A gas in an "excited state" describes a gas wherein at least some of the gas molecules are in vibrationally-excited, dissociated and/or ionized states. A gas (or precursor) may be a combination of two or more gases (or precursors). A "radical precursor" is used to describe plasma effluents (a gas in an excited state which is exiting a plasma) which participate in a reaction to either remove material from or deposit material on a surface. A "radical-oxygen precursor" is a radical precursor which contains oxygen and may be nitrogen-free in embodiments. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

The term "gap" is used throughout with no implication that the etched geometry has a large horizontal aspect ratio. Viewed from above the surface, gaps may appear circular, oval, polygonal, rectangular, or a variety of other shapes. A "trench" is a long gap (e.g. with a length to width ratio of greater than 5 or greater than 10). A trench may be in the shape of a moat around an island of material whose aspect ratio is the length or circumference of the moat divided by the width of the moat. The term "via" is used to refer to a low aspect ratio gap (as viewed from above) which may or may not be filled with metal to form a vertical electrical connection.

Having described several embodiments, it will be recognized by those of skill in the art that various modifications, alternative constructions, and equivalents may be used without departing from the spirit of the embodiments. Additionally, a number of well-known processes and elements have not been described to avoid unnecessarily obscuring the embodiments. Accordingly, the above description should not be taken as limiting the scope of the claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the disclosed embodiments, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the precursor" includes reference to one or more precursors and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. A method of processing a gapfill dielectric on a patterned substrate, the method comprising:
    forming a silicon-and-hydrogen-containing film on the patterned substrate, wherein the silicon-and-hydrogen-containing film fills a gap on the patterned substrate; and
    exposing the silicon-and-hydrogen-containing film to a carbon-and-hydrogen-containing precursor while exposing the silicon-and-hydrogen-containing film to UV-light, wherein the carbon-and-hydrogen-containing precursor comprises two, three or four carbon atoms and has a triple covalent bond between two carbon atoms.

2. The method of claim 1 wherein the carbon-and-hydrogen-containing precursor comprises $C_2H_2$.

3. The method of claim 1 wherein the carbon-and-hydrogen-containing precursor consists of hydrogen and carbon.

4. The method of claim 1 wherein forming the silicon-and-hydrogen-containing film comprises flowing material into the gap after initial deposition on the surface of the patterned substrate.

5. The method of claim 1 wherein the silicon-and-hydrogen-containing film contains no elements other than silicon, carbon, nitrogen, hydrogen and oxygen following the operation of exposing the silicon-and-hydrogen-containing film.

6. The method of claim 1 wherein a temperature of the patterned substrate while exposing the silicon-and-hydrogen-containing film is less than 150° C.

7. The method of claim 1 wherein the silicon-and-hydrogen-containing film is a porous film.

\* \* \* \* \*